United States Patent [19]

Way

[11] 4,062,051
[45] Dec. 6, 1977

[54] BATTERY SPARK SUPPRESSION CIRCUIT

[76] Inventor: Frederick L. Way, 3540 Swenson St., Apt. No. 124, Las Vegas, Nev. 89109

[21] Appl. No.: 674,829

[22] Filed: Apr. 7, 1976

[51] Int. Cl.² .................................................. H02H 7/22
[52] U.S. Cl. ......................................... 361/6; 361/10
[58] Field of Search ............... 317/11 C, 11 A, 11 R, 317/DIG. 6; 307/136, 135, 252 F; 361/3, 6, 10

[56] References Cited

U.S. PATENT DOCUMENTS

| | | | |
|---|---|---|---|
| 3,075,124 | 1/1963 | Bagno | 317/11 R |
| 3,122,659 | 2/1964 | Krestel et al. | 307/136 |
| 3,353,066 | 11/1967 | De Souza | 317/16 X |
| 3,408,538 | 10/1968 | Gurwicz | 317/11 R |
| 3,633,047 | 1/1972 | Kadah et al. | 307/252 F |
| 3,689,807 | 9/1972 | Tenenbaum | 317/141 S |
| 3,736,466 | 5/1973 | Fox et al. | 317/11 A |
| 3,783,305 | 1/1974 | Lefferts | 307/136 |
| 3,904,892 | 9/1975 | Leonard | 307/252 F |
| 3,912,941 | 10/1975 | Passarella | 307/136 |

Primary Examiner—J D Miller
Assistant Examiner—Patrick R. Salce
Attorney, Agent, or Firm—Brumbaugh, Graves, Donohue & Raymond

[57] ABSTRACT

A battery spark suppression circuit uses an SCR controlled rectifier to control current flow from a direct current source. A circuit is provided for triggering the SCR a selected time after a load is applied to the current source.

5 Claims, 2 Drawing Figures

BATTERY SPARK SUPPRESSION CIRCUIT

BACKGROUND OF THE INVENTION

This invention relates to circuits for preventing arcing upon connection or disconnection of a load to a direct current source. In particular, this invention relates to such arc preventing circuits which are not connected in parallel to the point of connection of the load to the direct current source.

The prevention of contact arcing is most important when a current source may be used in an atmosphere containing combustible gases. In such applications it is also desirable to prevent component overheating from short circuiting of the current source.

Most prior art circuits for preventing arcing upon connection or disconnection of a load to a direct current source have relied on their being circuit elements in parallel with the switch or connection point at which the direct current circuit is made. Such a parallel circuit implies a more or less permanent connection between the load and the current source. Typical of such prior art circuits is that described by Passrella in U.S. Pat. No. 3,912,941. The circuit described by Passarella utilizes a transistor arranged in series with the load. The transistor is controlled by a manual switch which is connected to one pole of the current source. Current is supplied to the load when the control switch is closed turning on the transistor.

U.S. Pat. No. 3,122,659 to Krestel et al also describes a prior art circuit which contemplates a relatively permanent connection between the current source and the load. The apparatus described by Krestel uses a mechanical relay to close the circuit between the current source and the load. Arranged in series with the relay is an SCR controlled rectifier which is triggered by the closing of the mechanical relay. The circuit described by Krestel is similar to that described by Passarella in that there is contemplated a relatively permanent connection between the load and the current source.

In U.S. Pat. No. 3,075,124 Bagno describes a circuit, which in one embodiment may be used without permanent connection between the load and the current source. The circuit described in Bagno's FIG. 1 includes voltage dividing resistors arranged between the current source and the point of load connection. A transistor is connected parallel to the voltage dividing resistors and controlled by the intermediate voltage. In the FIG. 1 embodiment a capacitor is arranged in parallel with the point of load connection, but it is pointed out in the specification that the circuit may be used without this capacitor. The Bagno circuit relies on the high frequency characteristics of the transistor to obtain arc suppression. The arrangement of voltage dividing resistors, in series with the switch, for controlling the transistor tends to effectuate a rapid transistor turn-on and rapid start of full current flow to the load. The period of delay prior to the turn-on of full current, which could cause arcing if the contact was intermittent is regulated entirely by the turn-on characteristics of the transistor used. When the contacts in the Bagno circuit are disconnected, the transistor provides some resistance against high frequency arcing, by reason of its high impedance at higher frequencies, but little protection is afforded against direct current switch arcing on disconnect, especially arcing resulting from the disconnection of an inductive load.

It is therefore an object of the present invention to provide a circuit for preventing arcing on connection or disconnection of a load to direct current source.

It is a further object of the present invention to provide such circuit having a selectable time delay prior to the initiation of current flow.

It is a still further object of the present invention to provide such a circuit for use in applications where the load is not permanently connected to the current source.

It is a still further object of the invention to provide such a circuit wherein the current source is rapidly disconnected upon the interruption of forward current.

It is a still further object of the present invention to provide such a circuit which also provides protection in the event the current source is short-circuited.

SUMMARY OF THE INVENTION

In accordance with the present invention there is provided a circuit for suppressing arcing upon connection or disconnection of a load to a direct current source. The circuit includes a silicon controlled rectifier, having first and second terminals and a control input, for permitting current to flow in a forward direction between the terminals in response to a signal applied to the control input. There is provided control means, connected across the terminals and responsive to forward voltage applied across the terminals, for applying a triggering signal to the control input a selected time after the voltage is applied. When the first terminal is connected to a first pole of a current source, and a load is connected between the second terminal and a second pole of the current source, a voltage is applied across the terminals causing the control means to apply a triggering signal to the control input and permitting current to flow through the controlled rectifier. When current is interrupted the controlled rectifier ceases to conduct the current.

In accordance with a preferred embodiment of the invention the control means includes a first resistor and a capacitor in series between the terminals, for providing a time variable voltage in response to the applied voltage. The control means also includes second and third resistors in series between the terminals for providing a reference voltage in response to the applied voltage. A programmable unijunction transistor is responsive to the time variable voltage and the reference voltage for providing the triggering signal. There may also be provided a diode between the first and second terminals for permitting current to flow between the terminals in a reverse direction.

In a further embodiment of the invention there may be additionally provided means, connected in series with the controlled rectifier and responsive to the magnitude of current, for interrupting the current flow when the current exceeds a predetermined value. The current interrupting means may be accomplished using a normally closed reed switch and a reed switch activating coil, both connected in series with the controlled rectifier.

For a better understanding of the present invention, together with other and further objects thereof, reference is had to the following description, taken in conjunction with the accompanying drawings and its scope will be pointed out in the appended claims.

DESCRIPTION OF THE INVENTION

Figure 1:
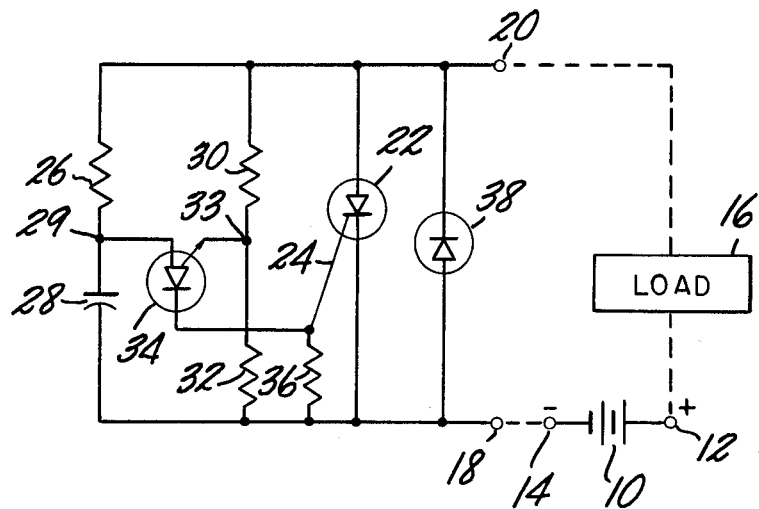
FIG. 1 is a schematic diagram of a preferred embodiment of the present invention illustrating its use with a current source and a load.

FIG. 1 shows a direct current source, comprising battery 10, having positive and negative terminals 12 and 14, respectively. Also shown is a load 16 which may be intermittently connected and disconnected to current source 10. According to the nature of load 16 there may occur arcing when it is connected or disconnected from battery 10, using a switch or merely attaching conductive leads. If load 16 includes a large shunt capacitance, there will be a large current draw immediately upon connection to the current source 10, since the capacitance will initially appear as a short-circuit. If load 16 includes series inductance, the stored energy in the inductive load will cause a large voltage across the contact gap upon interruption of the current to the load. In either event imperfect connection, intermittent connection or bouncing of switch contacts may cause arcing at the point at which the circuit is opened or closed.

In accordance with the present invention such contact arcing is prevented by use of the circuit shown in FIG. 1. The circuit has terminals 18 and 20 which are connected between the load 16 and battery 10. As will become evident the circuit may be placed on either side of load 16 so long as it is arranged for the correct direction of current flow from battery 10. In actual usage the circuit may be permanently connected to one pole, for example pole 14, of battery 10 in which case any desirable load may be connected between battery pole 12 and circuit terminal 20 without the danger of arcing upon connection or disconnection.

The circuit shown in FIG. 1 has a selenium controlled rectifier (SCR) 22 arranged between terminals 18 and 20. The SCR 22 is arranged to permit current flow from current source 10 through the load in a forward direction. A characteristic of the SCR is that it will not conduct current in either direction until a control voltage or pulse is applied to the control lead 24. When a control signal is applied, the SCR will conduct in a forward direction, but not in a reverse direction. Once the control signal is applied and as long as current flows through the SCR it will have a low resistance to current and will continue to conduct even in the absence of a further control signal.

Another characteristic of an SCR rectifier, which is important to the present invention, is that it will immediately turn off upon the cessation of forward current. Consequently, when current is flowing from current source 10 through load 12 and controlled rectifier 22, any interruption of the flow of current, such as an opening of the connection between load 16 and terminal 20 will cause the SCR 22 to immediately turn off. As a result, voltage from current source 10 or induced inductive voltage from load 16 will no longer appear across the partially open contact at the terminal 20, since the circuit will have been interrupted at SCR 22.

In the circuit of FIG. 1 there are provided circuit elements 26 through 36 for providing a control voltage to control input 24 of SCR 22. Resistor 26 and capacitor 28 are arranged in series between terminals 18 and 20.

When load 16 and current source 10 are connected between terminals 18 and 20 as indicated by the dotted line, and prior to the time when SCR 22 conducts, substantially the entire voltage of current source 10 is applied between terminals 18 and 20, assuming the resistance of load 16 is substantially smaller than that of resistor 26. The series RC circuit formed by resistor 26 and capacitor 28 causes there to occur a time varying, linearly increasing voltage at terminal 29 with respect to terminal 18.

Connection of load 16 and current source 10 between terminals 18 and 20 also causes there to be applied substantially the entire voltage of current source 10 across resistors 30 and 32. There consequently appears at intermediate terminal 33 a reference voltage, which is intermediate between the voltages at terminals 18 and 20. Programmable unijunction transistor 34 is responsive to the voltages at terminals 29 and 33. When the voltage at terminal 29 is approximately equal to the reference voltage at terminal 33 transistor 34 conducts and causes that voltage to be applied across resistor 36, thereby causing a control voltage to be applied to control input 24 of SCR 22. When this occurs SCR 22 starts to conduct and the voltage of current source 10 is applied across load 16. Those skilled in the art will recognize that the time delay between applying current source 10 and load 16 between terminals 18 and 20 and the turning on of SCR 22 will depend on the values selected for resistors 26, 30 and 32 and for capacitor 28. The time delay primarily depends on the value selected for resistor 26 and capacitor 28, which determine the time constant of the series RC circuit formed by these two components between terminals 18 and 20. Typically, these components will be selected to provide a time constant of 1/5th of a second or less, which it has been found to be adequate to prevent arcing when the load 16 and current source 10 are applied to terminals 18 and 20.

Once a control voltage has been applied to control input 24 of SCR 22, SCR 22 will continue to conduct until forward current through the SCR is interrupted. When it is conducting SCR 22 has a low resistance and there is no longer a voltage applied across the control circuit, and circuit elements 26 and 36 are inoperative.

When the circuit comprising current source 10 load 16 and SCR 22 is interrupted, there is a momentary cessation of forward current flow. This interruption of forward current flow causes an immediate and rapid turn off of SCR 22 thereby preventing further voltages from being applied against the opening contacts. This characteristic of the SCR is particularly important when the load is inductive in nature, such as an electromagnet or electric motor, since interruption of the forward current to an inductive device generally causes there to be generated a high voltage across the point of current interruption. Because of the rapid turn off of SCR 22 the connection between load 16 and current source 10 includes high value resistors 30 and 32 which will prevent significant arcing across the partially open contacts.

The circuit thus far described may be constructed using a small number of relatively inexpensive components. In a typical circuit application for use with a battery of approximately 15 to 22 volts the SCR may be either a General Electric type C-106 or type C-141 silicon control rectifier depending on the currents to be expected. Resistor 22 is 100,000 ohms, resistors 30 and 32 are 10,000 ohms each, resistor 36 is 100,000 ohms, and capacitor 28 is 2.2 microfarads. The programmable unijunction transistor 34 may be a General Electric type 2N6027. All of the resistors in the circuit may be of one-half watt power capacity.

The circuit described is inexpensive and compact so that it may be preferably built into a battery enclosure in combination with a rechargeable battery. In this case battery and circuit may be connected to any one of a number of loads, in an environment where sparking is undesired, without the danger of sparks upon connecting or disconnecting the load. When a battery and control circuit is manufactured in a single package with two output terminals, a person using the combination would most likely be unaware of the small delay during which the SCR 22 is triggered. In such a packaging there is provided two output terminals, just as an ordinary battery would have, and in such case it is desirable to provide a bypass of the SCR circuit for recharging the battery such as diode 38. Diode 38 may typically be a one amp, 50 PIV diode.

Figure 2:
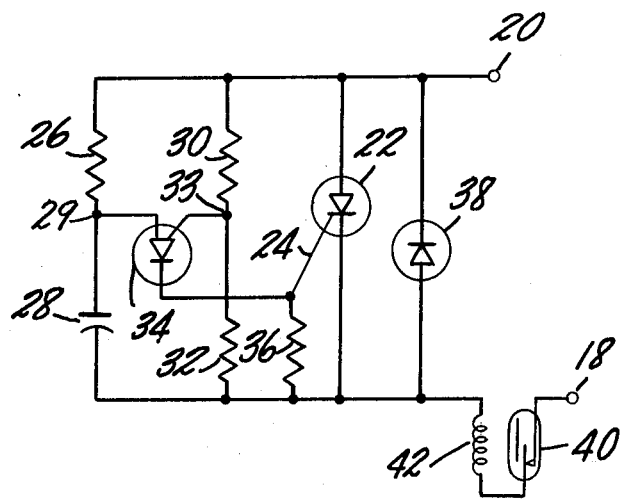
FIG. 2 is a schematic diagram of an embodiment of the present invention which includes a device for interrupting current in the event of a short-circuit.

In some applications it may be desirable to additionally provide protection against short circuiting the battery, because the resulting heating of components may present the danger of fire outbreak. FIG. 2 shows a circuit which provides such short circuit protection for the battery. The FIG. 2 circuit includes all of the components used in the FIG. 1 circuit, which are similarly numbered. There is additionally provided a normally closed reed switch 40 and a reed switch coil 42 arranged in series between SCR 22 and terminal 18. When a battery connected to terminal 18 is short circuited to terminal 20, SCR 22 is caused to conduct after the normal delay period. When SCR 22 conducts, a large current is caused to flow through reed switch coil 42 causing reed switch 40 to open. Coil 42 and switch 40 are arranged so that switch 40 remains closed when normally anticipated currents flow through coil 42, but opens when currents exceeding a predetermined value flow through coil 42. When coil 42 opens switch 40, forward current through SCR 22 is interrupted and SCR 22 will be turned off, thereby interrupting the current from the current source through the short circuit. The voltage of the current source will again be applied across the control circuit and after another time delay SCR 22 will again be turned on. Excessive current will again cause reed switch 40 to be opened interrupting the current. This cycle will be repeated slowly discharging the current source. Constant interruption of the current through the short circuit by reed switch 40 and the time delay provided by the control circuit cause a continuously interrupted discharge of the current source through the short circuit without the danger of overheating which may result from rapid discharge.

Those skilled in the art will recognize that other circuits than the one described may be used to provide a control signal to SCR 22. In accordance with the invention it is necessary only to provide a circuit which will apply a suitable control voltage to trigger SCR 22 a selected time after a voltage is applied between terminals 18 and 20.

While there have been described what are believed to be the preferred embodiments of the present invention, those skilled in the art will recognize that other modifications may be made thereto without departing from the true spirit and scope of the invention and it is therefore intended to claim all such modifications as fall within the true scope of the invention.

I claim:

1. A circuit for suppressing arcing upon connection or disconnection of a load to a direct current source, comprising:

a silicon controlled rectifier, having first and second terminals and a control input, for permitting current to flow in a forward direction between said terminals in response to a signal applied to said control input, said rectifier being connected to cease conducting on interruption of said forward current;

and automatic electronic control means connected across said terminals, and responsive to forward voltage applied across said terminals for applying a triggering signal to said control input a selected time after said voltage is applied;

whereby when said first terminal is connected to a first pole of the current source, and the load is connected between said second terminal and a second pole of the current source, a voltage is applied across said terminals causing said control means to apply a triggering signal to said control input, thereby permitting current to flow through said controlled rectifier, and when said current is interrupted, said controlled rectifier ceases to conduct said current.

2. A circuit as specified in claim 1 wherein said control means includes;

a first resistor and a capacitor in series between said terminals, for providing a time variable voltage in response to said applied voltage;

second and third resistors in series between said terminals for providing a reference voltage in response to said applied voltage;

and a programmable unijunction transistor responsive to said time variable voltage and said reference voltage for providing said triggering signal.

3. A circuit as specified in claim 2 wherein there is provided a diode between said first and second terminals for permitting current to flow between said terminals in a reverse direction.

4. A circuit as specified in claim 1 wherein there is additionally provided means, connected in series with said controlled rectifier, and responsive to the magnitude of said current, for interrupting current flow when said current exceeds a predetermined value.

5. A circuit as specified in claim 4 wherein said means for interrupting current flow comprises a normally closed reed switch and a reed switch activating coil in series with said reed switch.

* * * * *